(12) United States Patent
Schwegler et al.

(10) Patent No.: US 7,847,404 B1
(45) Date of Patent: Dec. 7, 2010

(54) CIRCUIT BOARD ASSEMBLY AND PACKAGED INTEGRATED CIRCUIT DEVICE WITH POWER AND GROUND CHANNELS

(75) Inventors: Bruce Schwegler, Morgan Hill, CA (US); Kee W. Park, San Jose, CA (US); Jeff Vesey, Santa Cruz, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 88 days.

(21) Appl. No.: 12/052,234

(22) Filed: Mar. 20, 2008

Related U.S. Application Data

(60) Provisional application No. 60/908,886, filed on Mar. 29, 2007.

(51) Int. Cl.
| | |
|---|---|
| H01L 23/48 | (2006.01) |
| H01L 23/52 | (2006.01) |
| H01L 29/40 | (2006.01) |
| H01L 23/34 | (2006.01) |
| H05K 1/18 | (2006.01) |
| H05K 1/11 | (2006.01) |

(52) U.S. Cl. .................. 257/758; 257/532; 257/724; 361/763; 361/794

(58) Field of Classification Search .......... 257/734, 257/774, 737, 778, 758; 361/753, 763, 794, 361/799
See application file for complete search history.

(56) References Cited

U.S. PATENT DOCUMENTS

| | | | |
|---|---|---|---|
| 5,753,976 A * | 5/1998 | Harvey .................. | 257/774 |
| 5,872,338 A | 2/1999 | Lan et al. | |
| 6,100,573 A * | 8/2000 | Lu et al. ................. | 257/508 |
| 6,346,743 B1 | 2/2002 | Figueroa et al. | |
| 6,476,477 B2 * | 11/2002 | Li et al. ................. | 257/691 |
| 6,521,994 B1 | 2/2003 | Huse et al. | |

(Continued)

*Primary Examiner*—Leonardo Andújar
*Assistant Examiner*—Teresa M. Arroyo
(74) *Attorney, Agent, or Firm*—Kenneth Glass; Glass & Associates

(57) ABSTRACT

A packaged integrated circuit device and a circuit board assembly are disclosed that include a semiconductor die and a package substrate that includes a first grid array of contact pads that are electrically coupled to corresponding contact pads on the semiconductor die. The first grid array of contact pads includes a first set of adjacent rows or columns of contact pads that are coupled to a first channel that extends within a ground plane of the package substrate. The first grid array of contact pads includes a second set of adjacent rows or columns of contact pads that are electrically coupled to a second channel that extends within a power plane of the package substrate. The contact pads in the first set of adjacent rows or columns of contact pads directly overlie a portion of the first channel and the contact pads in the second set of adjacent rows or columns of contact pads directly overlie a portion of the second channel. A circuit board assembly is disclosed that includes a first grid array of contact pads disposed on a top side of a circuit board. The circuit board includes a first channel that extends within a ground plane of the circuit board and a second channel that extends within a power plane of the circuit board. The circuit board assembly can include decoupling capacitors disposed on the top side of the circuit board and the packaged integrated circuit device can include decoupling capacitors attached to the top of the package substrate.

12 Claims, 13 Drawing Sheets

U.S. PATENT DOCUMENTS

| | | | |
|---|---|---|---|
| 6,556,453 B2 * | 4/2003 | Figueroa et al. | 361/763 |
| 6,627,999 B2 | 9/2003 | Akram et al. | |
| 6,680,218 B2 * | 1/2004 | Chung et al. | 438/108 |
| 6,703,714 B2 | 3/2004 | Akram et al. | |
| 6,717,270 B1 * | 4/2004 | Downey et al. | 257/758 |
| 6,757,175 B1 * | 6/2004 | Bartley et al. | 361/775 |
| 6,774,484 B2 * | 8/2004 | Mimino et al. | 257/728 |
| 6,828,682 B1 * | 12/2004 | Ramakrishnan | 257/758 |
| 7,075,185 B2 * | 7/2006 | Nelson et al. | 257/774 |
| 7,085,143 B1 * | 8/2006 | Dyckman et al. | 361/820 |
| 7,329,958 B1 | 2/2008 | Shah et al. | |
| 2002/0015293 A1 * | 2/2002 | Akiba et al. | 361/793 |
| 2002/0159243 A1 * | 10/2002 | Ogawa et al. | 361/760 |
| 2003/0045083 A1 | 3/2003 | Towle et al. | |
| 2003/0198031 A1 * | 10/2003 | Peterson | 361/760 |
| 2004/0036174 A1 * | 2/2004 | Downey et al. | 257/758 |
| 2005/0017345 A1 * | 1/2005 | Sathe | 257/700 |
| 2005/0248040 A1 * | 11/2005 | Osburn | 257/786 |
| 2006/0225916 A1 * | 10/2006 | Nelson et al. | 174/255 |

* cited by examiner

CIRCUIT BOARD ASSEMBLY AND PACKAGED INTEGRATED CIRCUIT DEVICE WITH POWER AND GROUND CHANNELS

CROSS-REFERENCE TO RELATED APPLICATIONS

The present application claims benefit of U.S. Provisional Patent Application Ser. No. 60/908,886, filed Mar. 29, 2007, entitled "Flip-Chip Package with Ground and Power Channels."

BACKGROUND

Conventional flip-chip integrated circuit devices include a grid array of contact pads for electrically and mechanically connecting the flip-chip integrated circuit device to external circuitry. Typically, the contact pads in the array are arranged such that power and ground contact pads are located near the center of the array. Data pins are typically located in various locations throughout the array and are located around the periphery of the array.

This conventional "pin-out" arrangement works well for grid array patterns having 1 millimeter pitch or greater and intermediate frequency integrated circuit devices. However, with high frequency and high current integrated circuit devices and smaller pitch grid arrays, this conventional package substrate design may not provide adequate power and ground connectivity for the integrated circuit device to properly function.

More particularly, openings within power planes and ground planes in the package substrate and in the circuit board allow vias to connect to underlying structures. This significantly reduces the contiguous surface area of the ground plane and the power plane under the flip-chip. In addition, vias in the package substrate that connect to signal pins and some vias in the circuit board that connect to signal pins must pass through both the ground plane and the power plane. Isolation rings extend around these microvias to prevent noise that can disrupt the data signals. Though the isolation rings are effective for noise reduction, they further reduce the size of the ground plane and the size of the power plane.

As a result of the aforementioned reduction in surface area of power and ground planes under the flip-chip, in packages having a high pin count and small-pitch there may not be enough contiguous power plane area and ground plane area to effectively couple power and ground to the integrated circuit device. Moreover, the reduced surface area increases the impedance of the interconnect path. This increased impedance can render the flip-chip integrated circuit device inoperable in high frequency, high current applications.

Accordingly, there is a need for a method and apparatus that will allow for effectively coupling power and ground to flip-chip integrated circuit devices.

SUMMARY

An integrated circuit device is disclosed that includes a grid array of contact pads, where some of the contact pads for coupling power are arranged in a first set of adjacent rows or columns of contact pads and some of the contact pads for coupling ground are arranged in a second set of adjacent rows or columns of contact pads. This provides sufficient contiguous surface area in the power plane and in the ground plane to effectively couple power and ground to the semiconductor die.

A packaged integrated circuit device is disclosed that includes a semiconductor die and a package substrate that includes a first grid array of contact pads that are electrically coupled to corresponding contact pads on the semiconductor die. The first grid array of contact pads includes a first set of adjacent rows or columns of contact pads that are coupled to a first channel that extends within a ground plane of the package substrate. The first grid array of contact pads includes a second set of adjacent rows or columns of contact pads that are electrically coupled to a second channel that extends within a power plane of the package substrate. The contact pads in the first set of adjacent rows or columns of contact pads directly overlie a portion of the first channel and the contact pads in the second set of adjacent rows or columns of contact pads directly overlie a portion of the second channel.

In one embodiment the packaged integrated circuit device includes a plurality of decoupling capacitors that are disposed on the same side of the package substrate as the semiconductor die, wherein each of the decoupling capacitors are electrically coupled to the first channel and to the second channel.

A circuit board assembly is disclosed that includes a first grid array of contact pads disposed on a top side of the circuit board. This first grid array of contact pads includes a first set of adjacent rows or columns of contact pads that are coupled to a first channel that extends within a ground plane of the circuit board and a second set of adjacent rows or columns of contact pads that are coupled to a second channel that extends within a power plane of the circuit board. The contact pads in the first set of adjacent rows or columns of contact pads directly overlie a portion of the first channel and the contact pads in the second set of adjacent rows or columns of contact pads directly overlie a portion of the second channel. The circuit board assembly also includes a plurality of decoupling capacitors disposed on the top side of the circuit board. Each of the plurality of decoupling capacitors extend directly over a portion of the first channel and directly over a portion of the second channel, and each of the plurality of decoupling capacitors are electrically coupled to the first channel and electrically coupled to the second channel.

The use of adjacent rows or columns that consist entirely of contact pads for coupling power to the integrated circuit device provides for a contiguous channel in each power plane that extends completely across each array of contact pads. Similarly, the use of adjacent rows or columns that consist entirely of contact pads for coupling ground to the integrated circuit device provides for a contiguous channel in the ground plane that extends completely across each array of contact pads. The channels in the ground plane and the power plane lower the impedance of the package substrate, providing low impedance pathways for coupling power and ground to the integrated circuit device. Moreover, embodiments of the present invention that include decoupling capacitors provide sufficient capacitance to power high frequency and high current integrated circuit devices such as content addressable memory devices. These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
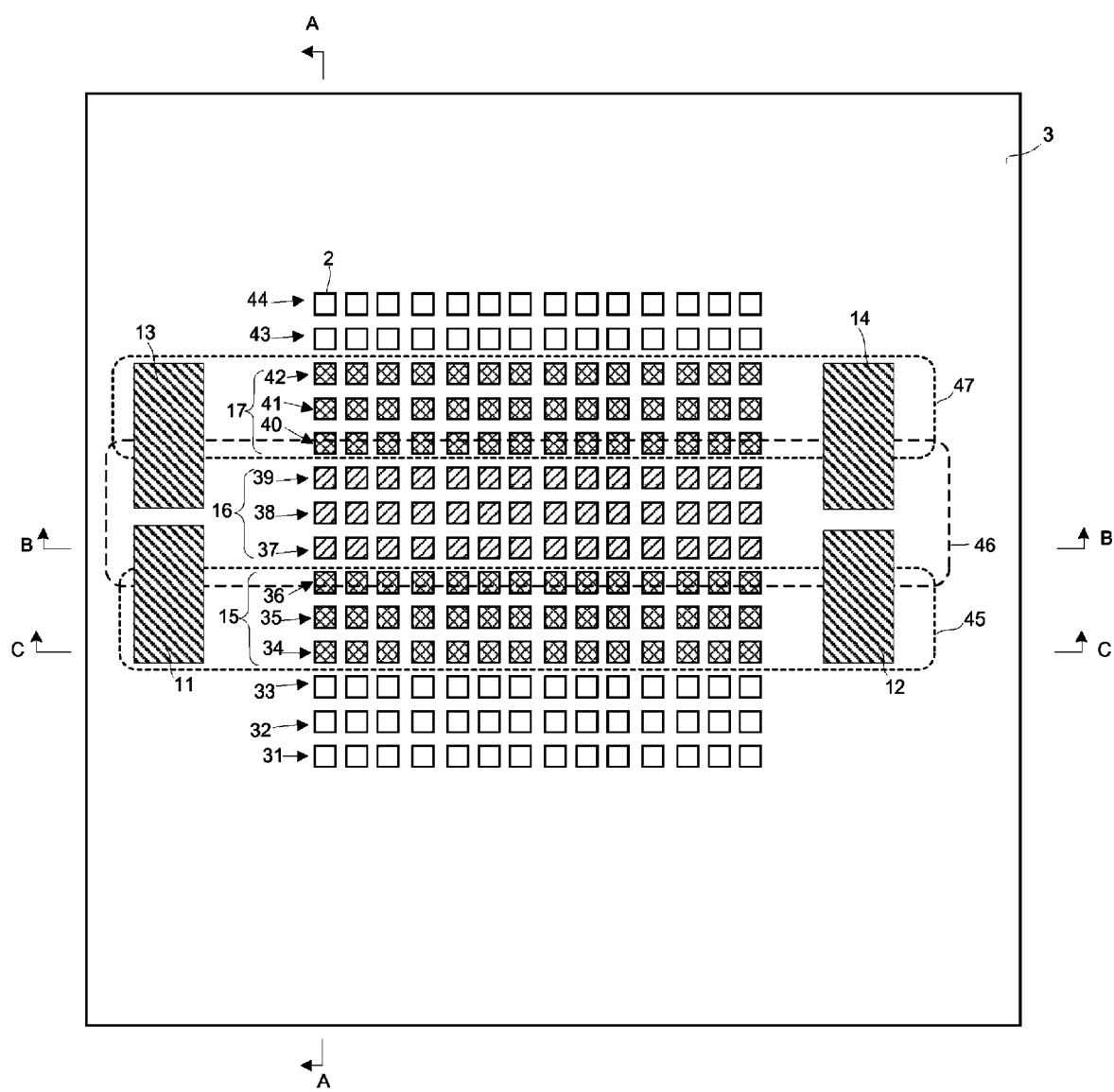
FIG. 1 is a top view of a package substrate that includes an array of contact pads, where contiguous metallization in an underlying ground plane that forms channels in the ground plane is shown in dashed lines and contiguous metallization in an underlying power plane that forms a channel in the power plane is shown in a dashed line, where the other portions of the underlying power plane and the other portions of the underlying ground plane are not shown, in accordance with an embodiment of the present invention.
Figure 2:
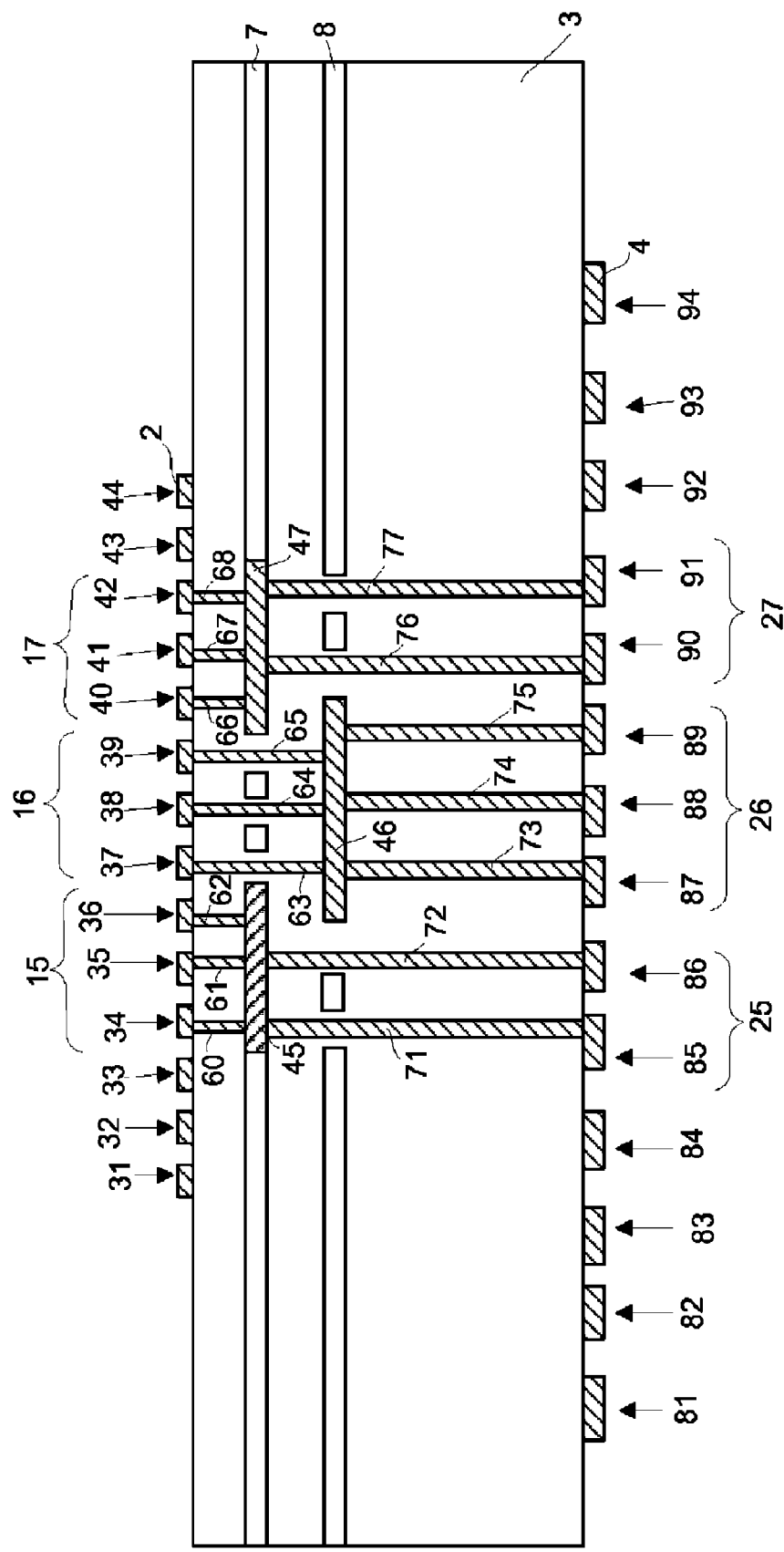
FIG. 2 is a cross sectional view along section A-A shown in FIG. 1, where contiguous metallization in the ground plane that forms channels in the ground plane is shown as a hatched fill area and contiguous metallization in the power plane that forms a channel in the power plane is shown as a hatched fill area, in accordance with an embodiment of the present invention.
Figure 3:
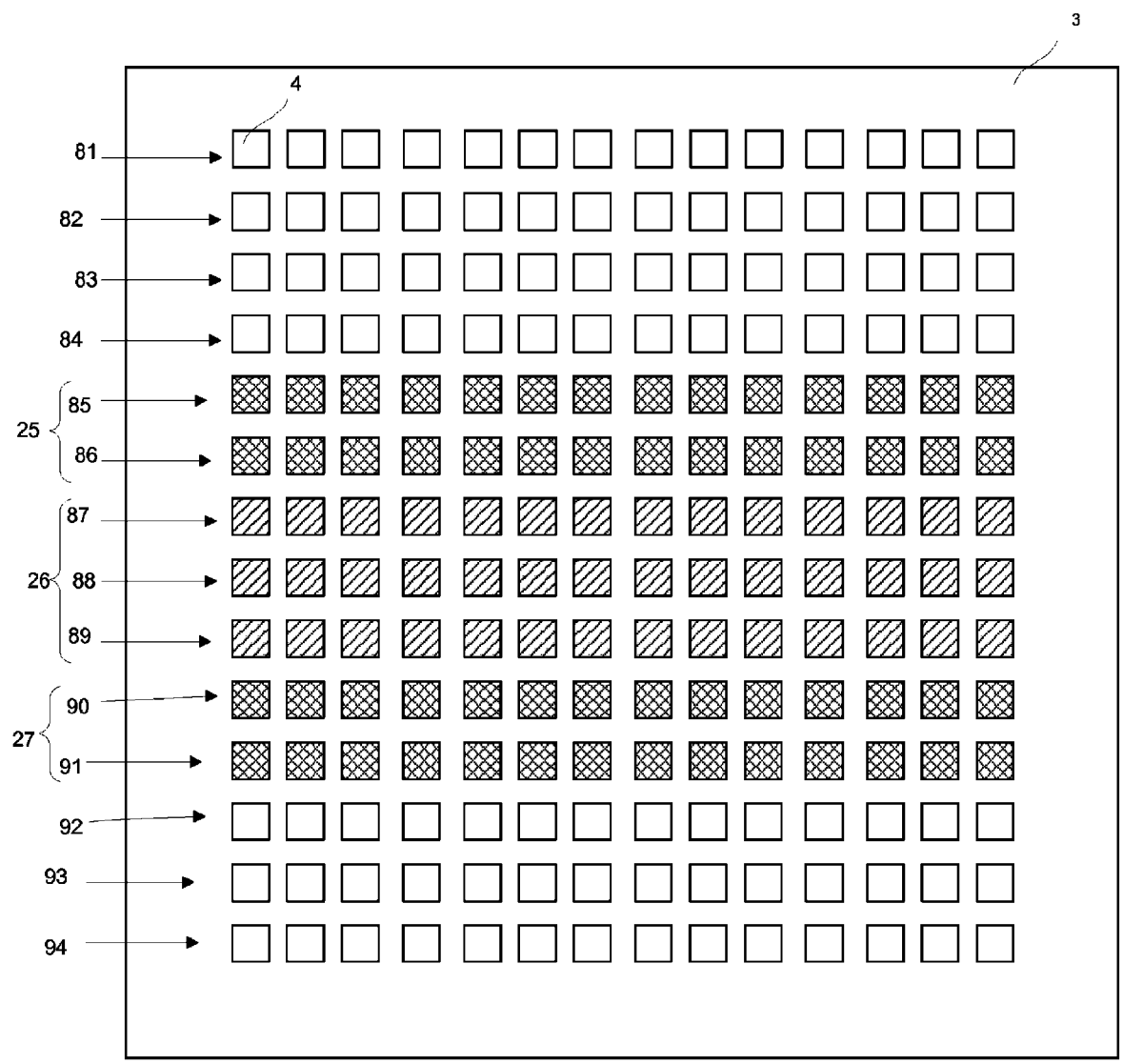
FIG. 3 is a bottom view of the package substrate, in accordance with an embodiment of the present invention.

FIGS. 1-3 show a package substrate 3 that includes a grid array of contact pads 2. Grid array of contact pads 2 includes a first set of adjacent rows of contact pads 15 that are coupled to a first channel 45 that extends within a ground plane 7 of package substrate 3. Grid array of contact pads 2 includes a second set of adjacent rows of contact pads 16 that are electrically coupled to a second channel 46 that extends within a power plane 8 of the package substrate 3. The contact pads in first grid array of contact pads 15 directly overlie a portion of the first channel 45 and the contact pads in the second grid array of contact pads 16 directly overlie a portion of the second channel 46.

In order to more clearly show the concepts of the present invention, only 14 rows (rows 31-44) and 14 columns are illustrated in the Figures. However, integrated grid array of contact pads 2 and grid array of contact pads 4 will include many more rows and columns. In addition, the number of rows may not be the same as the number of columns. Also, the number of rows and columns on grid array of contact pads 2 may not be the same as on grid array of contact pads 4.

First set of rows of contact pads 15 includes all of the contact pads in row 34, all of the contact pads in adjacent row of contact pads 35 and all of the contact pads in adjacent row of contact pads 36. In this embodiment, first set of rows of contact pads 15 includes three rows. However, it is appreciated that first set of rows of contact pads 15 can include only two rows or can include more rows, where each row is adjacent to another row in first set of rows of contact pads 15.

Second set of rows of contact pads 16 includes all of the contact pads in row 37, all of the contact pads in row 38, and all of the contact pads in row 39. Each row of contact pads 37-39 is adjacent to another row in second set of rows of contact pads 16. More particularly, row of contact pads 37 is adjacent to row of contact pads 38 and row of contact pads 38 is adjacent to row of contact pads 39. In this embodiment, second set of rows of contact pads 16 includes three rows. However, alternatively, second set of rows of contact pads 16 can include only two rows or can include more than three rows, where each row is adjacent to another row in second set of rows of contact pads 16.

Referring now to FIGS. 2-3, a second grid array of contact pads 4 is disposed on the opposite side of package substrate 3 from the first grid array of contact pads 2. Second grid array of contact pads 4 includes a third set of adjacent rows of contact pads 25 that are coupled to first channel 45 and a fourth set of adjacent rows of contact pads 26 that are electrically coupled to second channel 46. Third set of adjacent rows of contact pads 25 directly underlie a portion of first channel 45 and fourth set of adjacent rows of contact pads 26 directly underlie a portion of second channel 46.

Third set of adjacent rows of contact pads 25 includes all of the contact pads in rows 85-86. Each row 85-86 is adjacent to another row in third set of adjacent rows of contact pads 25 since row of contact pads 85 is adjacent to row of contact pads 86. Fourth set of adjacent rows of contact pads 26 includes all of the contact pads in rows 87-89. Each row 87-89 is adjacent to another row in second set of adjacent rows of contact pads 26. More particularly, row of contact pads 87 is adjacent to row of contact pads 88 and row of contact pads 88 is adjacent to row of contact pads 89.

Decoupling capacitors 11-12 are disposed on the top side of package substrate 3. Each of decoupling capacitors 11-12 is electrically coupled to first channel 45 and to second channel 46. In the present embodiment, each decoupling capacitor 11-12 is a discrete device that extends directly over a portion of first channel 45 and directly over a portion of second channel 46. Decoupling capacitor 11 extends proximate one end of first channel 45 and second channel 46, and decoupling capacitor 12 extends proximate the opposite end of the channel 45 and second channel 46.

In the present embodiment first grid array of contact pads 2 includes a fifth set of adjacent rows of contact pads 17 that are electrically coupled to a third channel 47 that extends within ground plane 7 of package substrate 3. Fifth set of rows of contact pads 17 includes all of the contact pads 2 in adjacent rows 40-42.

Second grid array of contact pads 4 includes a sixth set of adjacent rows or rows of contact pads 27 that directly underlie a portion of third channel 47. Each of contacts 4 in sixth set of adjacent rows of contact pads 27 is electrically coupled to third channel 47. Sixth set of adjacent rows of contact pads 27 includes all of the contact pads 4 in rows 90-91.

Additional decoupling capacitors 13-14 are electrically coupled to second channel 46 and to third channel 47. In the present embodiment, each of additional decoupling capacitors 13-14 is a discrete device that extends directly over a portion of second channel 46 and directly over a portion of third channel 47.

In the present embodiment vias 60 attach to contact pads in row 34, vias 61 attach to contact pads 2 in row 35, vias 62 attach to contact pads 2 in row 36, vias 63 attach to contact pads 2 in row 37, vias 64 attach to contact pads 2 in row 38, vias 65 attach to contact pads 2 in row 39, vias 66 attach to contact pads 2 in row 40, vias 67 attach to contact pads 2 in row 41, vias 68 attach to contact pads 2 in row 42, vias 71 attach to contact pads 4 in row 85, vias 72 attach to contact pads 4 in row 86, vias 73 attach to contact pads 4 in row 87, vias 74 attach to contact pads 4 in row 88, vias 75 attach to contact pads 4 in row 89, vias 76 attach to contact pads 4 in row 90 and vias 77 attach to contact pads 4 in row 91. Each via 60-62 and 71-72 contacts channel 45, with vias 71-72 extending through openings in power plane 8. Each via 63-65 and 73-75 contacts channel 46, with vias 63-65 extending through openings in ground plane 7. Similarly, each via 66-68 and 76-77 contacts channel 47, with vias 76-77 extending through openings in power plane 8.

Package substrate 3 can be formed by integrating layers of dielectric and conductive material, and patterning top and bottom conductive layers to form grid array of contact pads 2 and grid array of contact pads 4. Alternatively, grid array of contact pads 2 and 4 can be formed by selective deposition of a conductive material such as metal on the top surface of package substrate 3. Vias 60-68 and 71-77 can be formed by etching or drilling openings, and filing the openings with conductive material. In the present embodiment, dielectric material extends within ground plane 7 and power plane 8 to electrically isolate vias 63-65 from ground plane 7, and to electrically isolate vias 71-72 and 76-77 from power plane 8.

Figure 4:
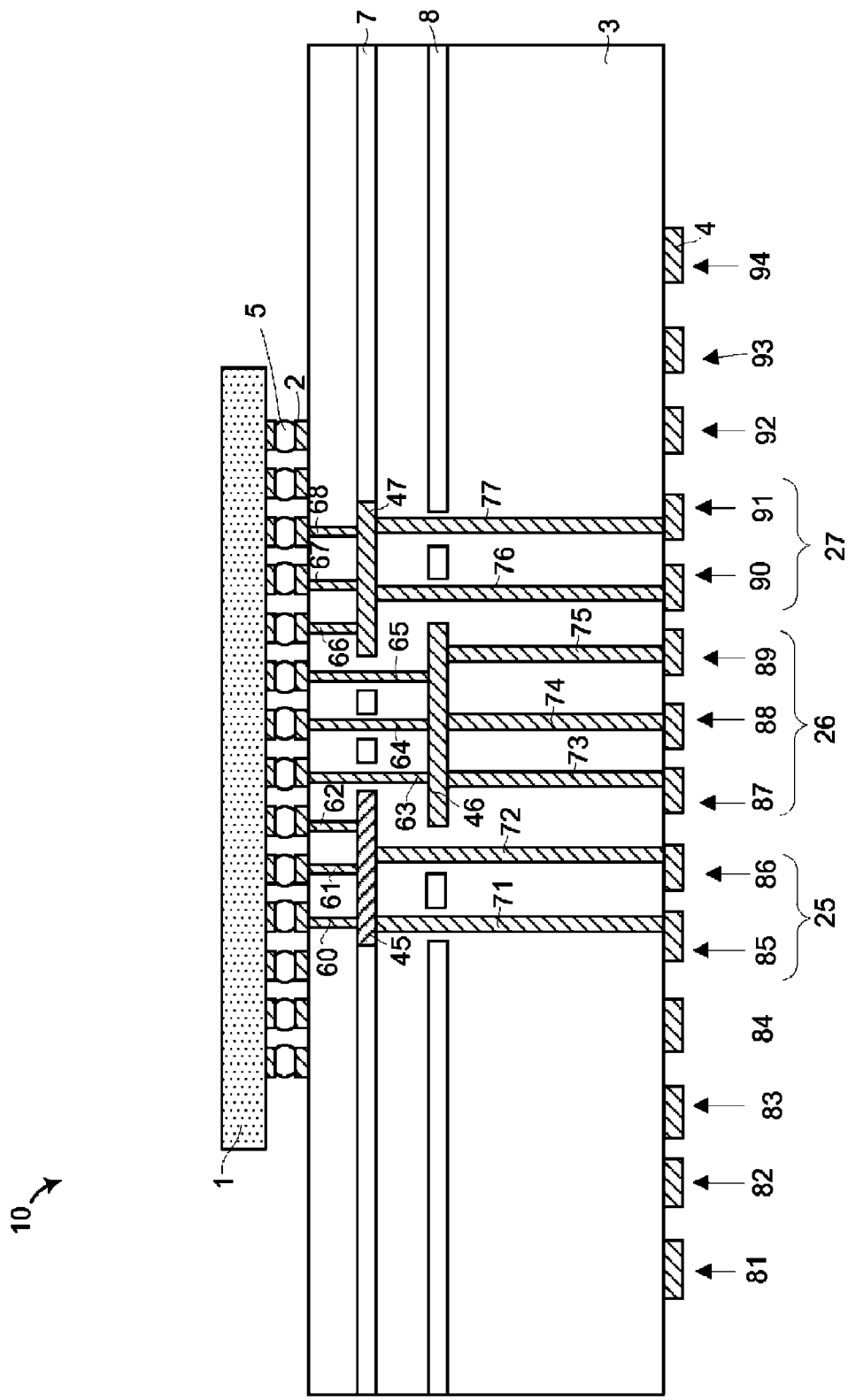
FIG. 4 is a cross sectional view along section A-A shown in FIG. 1, after a semiconductor die has been coupled to the top surface of the package substrate to form a packaged integrated circuit device, where contiguous metallization in the ground plane that forms channels in the ground plane is shown as a hatched fill area and contiguous metallization in the power plane that forms a channel in the power plane is shown as a hatched fill area, in accordance with an embodiment of the present invention.
Figure 5:
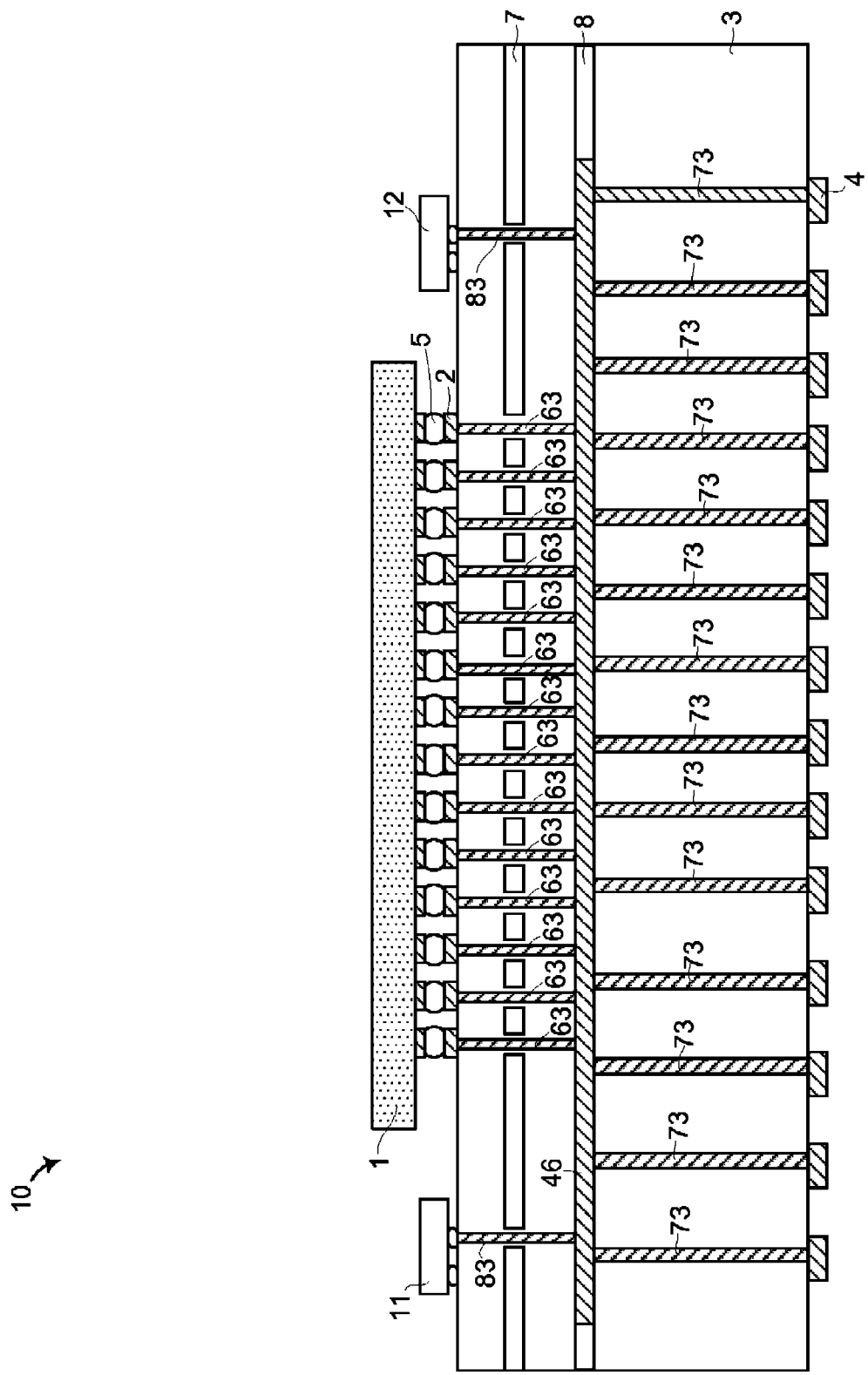
FIG. 5 is a cross sectional view along section B-B shown in FIG. 1, of the packaged integrated circuit device, where contiguous metallization in the power plane that forms a channel in the power plane is shown as a hatched fill area, in accordance with an embodiment of the present invention.
Figure 6:
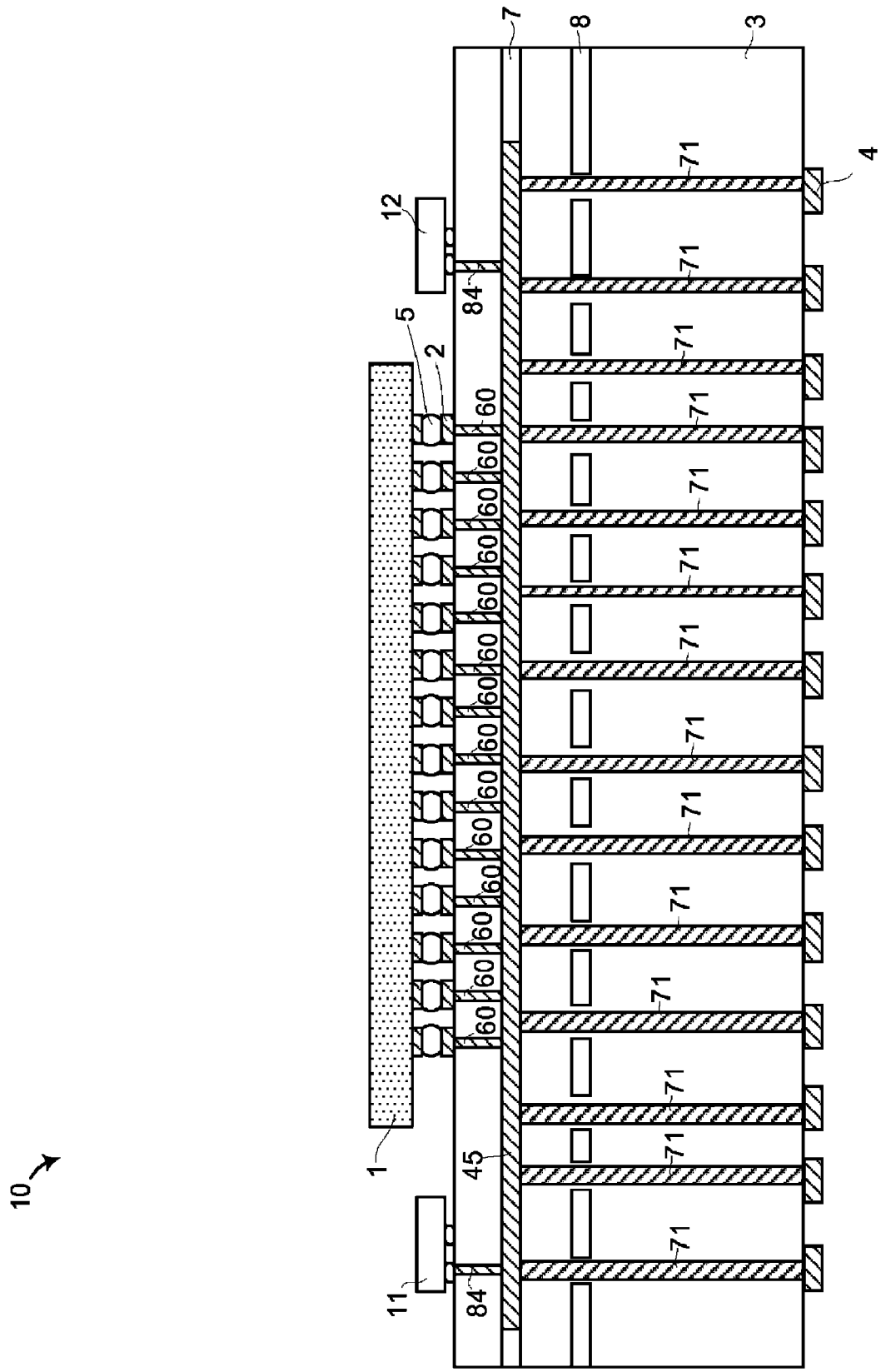
FIG. 6 is a cross sectional view along section C-C shown in FIG. 1, of the packaged integrated circuit device, where contiguous metallization in the ground plane that forms a channel in the ground plane is shown as a hatched fill area, in accordance with an embodiment of the present invention.

FIGS. 4-6 show a packaged integrated circuit device 10 that is formed by coupling a semiconductor die 1 to package substrate 3. Solder bumps 5 electrically and mechanically couple semiconductor die 1 to package substrate 3. In the present embodiment grid array of contact pads 2 corresponds to a grid array of contact pads on semiconductor die 1. More particularly, in the present embodiment, grid array of contact pads 2 has the same number of rows, the same number of rows, and approximately the same pitch as the grid array of contact pads on semiconductor die 1. In one embodiment grid array of contact pads 2 has a 0.2 millimeter pitch and grid array of contact pads 4 has a pitch of 1 millimeter. In the present embodiment, integrated circuit device 10 is a flip-chip packaged integrated circuit device that includes a semiconductor die 1 that is a high frequency, high current, device. In one specific embodiment semiconductor die 1 is a content addressable memory.

In the present embodiment each of the contact pads in sets of adjoining rows of contact pads 15, 17, 25 and 27 couple a ground voltage level to semiconductor die 1. Each of the contact pads in set of columns of contact pads 16 and 26 couple a power voltage level to integrated circuit device 10. Remaining rows 31-33 and 43-44, 81-84 and 92-94 can couple power, ground or signals between semiconductor die 1 and external circuitry.

Channel 45 extends directly under rows of contact pads 34-36 and above rows of contact pads 85-86, providing a low impedance pathway for coupling ground to semiconductor die 1. Channel 46 extends directly under rows of contact pads 37-39 and above rows of contact pads 87-89, providing a low impedance pathway for coupling power to semiconductor die 1. Channel 47 extends directly under rows of contact pads 40-42 and over rows of contact pads 90-91, providing an additional low impedance pathway for coupling ground to semiconductor die 1.

Referring now to FIGS. 5-6 decoupling capacitors 11-14 are disposed over the top surface of package substrate 3, and electrically coupled to ground plane 7 and power plane 8. In the present embodiment, vias 83 electrically connect to power plane 8 and are attached to each decoupling capacitor 11-14 using solder or conductive adhesive. Vias 84 electrically connect to ground plane 7 and are attached to each decoupling capacitor 11-14 using solder or conductive adhesive.

In the present embodiment channels 45-47 extend laterally past decoupling capacitors 11-14. Therefore, the contiguous metallization of channel 45 extends directly under rows of contact pads 34-36, under portions of decoupling capacitors 11-12 and directly over rows of contact pads 85-86. The contiguous metallization of channel 46 extends directly under rows of contact pads 37-39, under portions of decoupling capacitor 11-14 and directly over rows of contact pads 87-89. The contiguous metallization of channel 47 extends directly under rows of contact pads 40-42, under portions of decoupling capacitors 13-14 and directly over rows of contact pads 90-91.

Because each of channels 45-47 extend under more than one row of contact pads, they each have significant width. Moreover, channels 45 and 47 are not interrupted by vias that couple to power, signal pins or isolation rings and channel 46 is not interrupted by vias that couple to ground, signal pins or isolation rings. Accordingly, channels 45-47 provide a significant amount of contiguous metallization. In addition, since decoupling capacitors 11-14 are connected directly to a power channel and a ground channel by a via, sufficient capacitance is provided to provide power and ground a semiconductor die 1 that is a high frequency, high current integrated circuit device.

Figure 7:
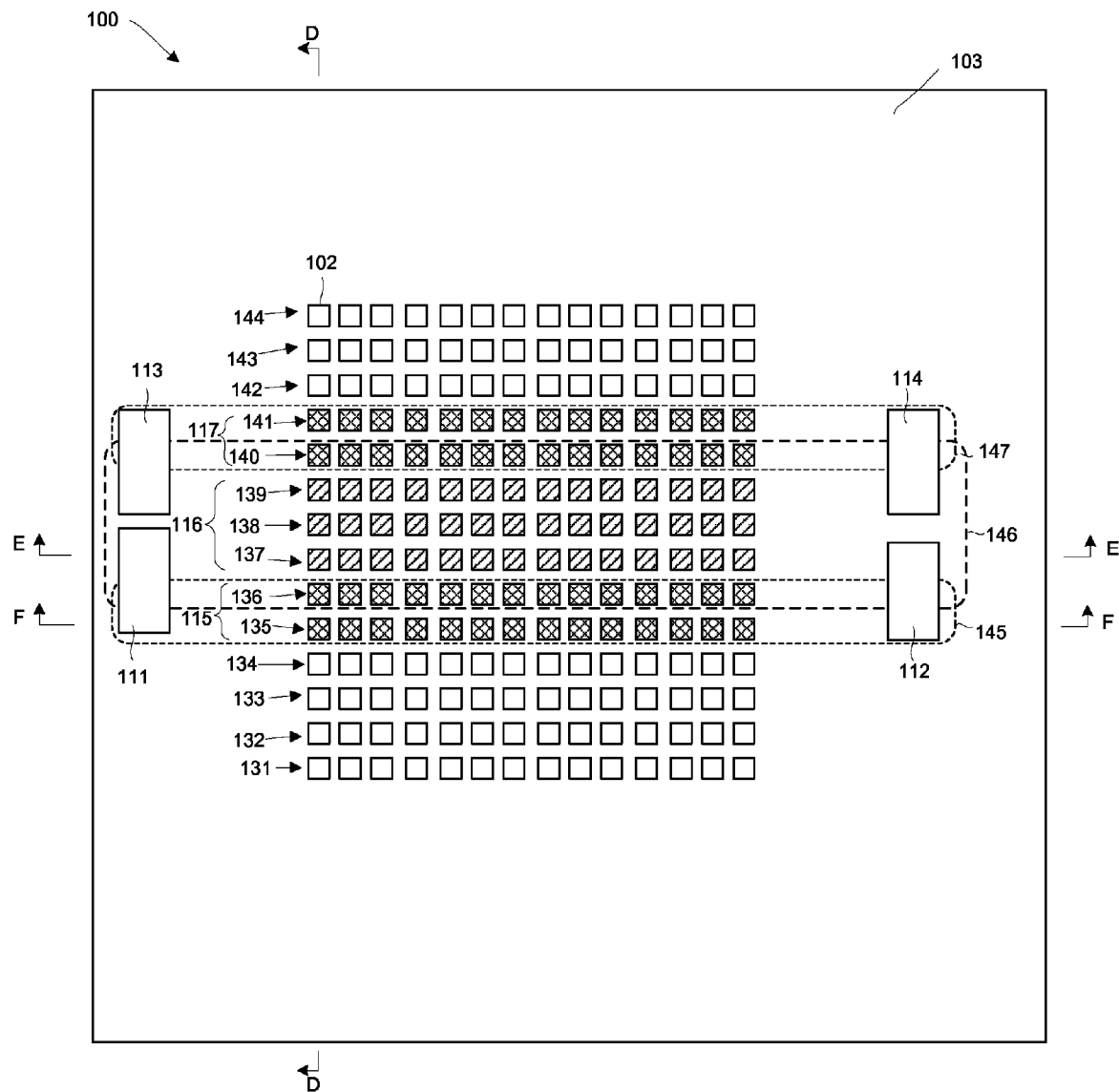
FIG. 7 is a top view of a circuit board assembly that includes a grid array of contact pads, where four decoupling capacitors are mounted to the top surface of the circuit board, in accordance with an embodiment of the present invention.

Referring now to FIG. 7, a circuit board assembly 100 is shown that includes a circuit board 103 that includes a first grid array of contact pads 102 disposed on a top side of circuit board 103. In the present embodiment grid array of contact pads 102 corresponds to grid array of contact pads 4. More particularly, in the present embodiment, grid array of contact pads 102 has the same number of columns, the same number of rows, and approximately the same pitch as grid array of contact pads 4.

Grid array of contact pads 102 includes a first set of adjacent rows of contact pads 115 that are coupled to a first channel 145 that extends within a ground plane 107 of circuit board 103 and a second set of adjacent rows of contact pads 116 that are coupled to a second channel 146 that extends within a power plane 108 of the circuit board 103. In the present embodiment, first set of adjacent rows of contact pads 115 includes all of the contact pads in row 135 and all of the contact pads in adjacent row of contact pads 136. Second set of adjacent rows of contact pads 116 includes all of the contact pads 102 in rows 137-139. Contact pads 102 in the first set of adjacent rows of contact pads 115 directly overlie a portion of the first channel 145 and the contact pads 102 in the second set of adjacent rows of contact pads 116 directly overlie a portion of second channel 146.

Grid array of contact pads 102 includes a third set of adjacent rows of contact pads 117 that directly overlie a portion of a third channel 147 that extends within ground plane 107 of circuit board 103. Third set of rows of contact pads 117 includes all of the contact pads in rows 140-141.

In the present embodiment each of the contact pads in rows 135-136 and 140-141 couple ground to packaged integrated circuit device 110 and each of the contact pads in rows 137-139 couple power to packaged integrated circuit device 10. Remaining rows 131-134 and 142-144 can include contact pads 102 for coupling power, ground or signals between the internal circuitry of packaged integrated circuit device 10 and external circuitry.

Figure 8:
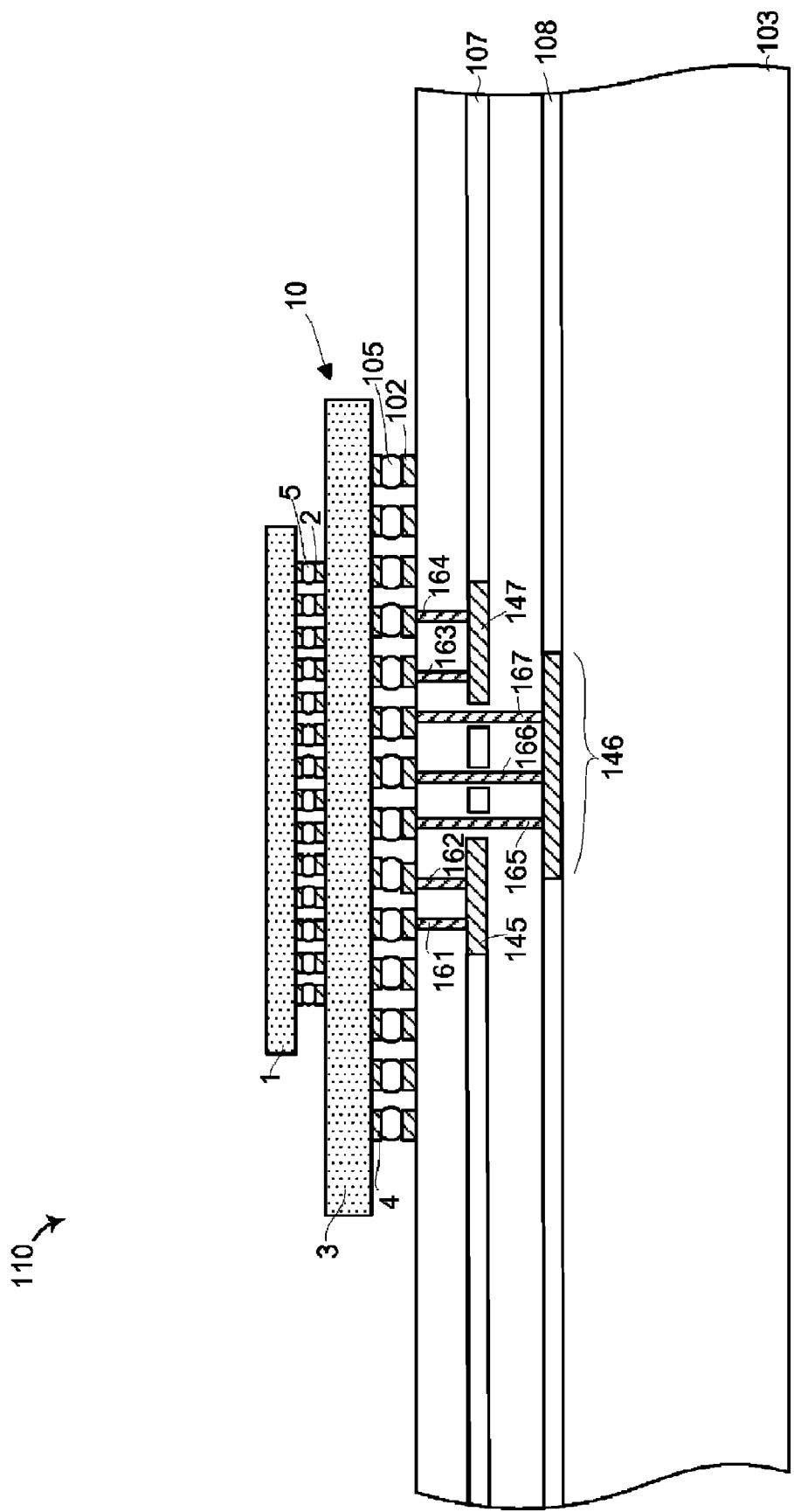
FIG. 8 is a cross sectional view of a the circuit board of FIG. 7 along section D-D shown in FIG. 7, after the packaged integrated circuit device of FIGS. 1-6 has been attached, where contiguous metallization in the ground plane that forms channels in the ground plane is shown as a hatched fill area and contiguous metallization in the power plane that forms a channel in the power plane is shown as a hatched fill area, in accordance with an embodiment of the present invention.
Figure 9:
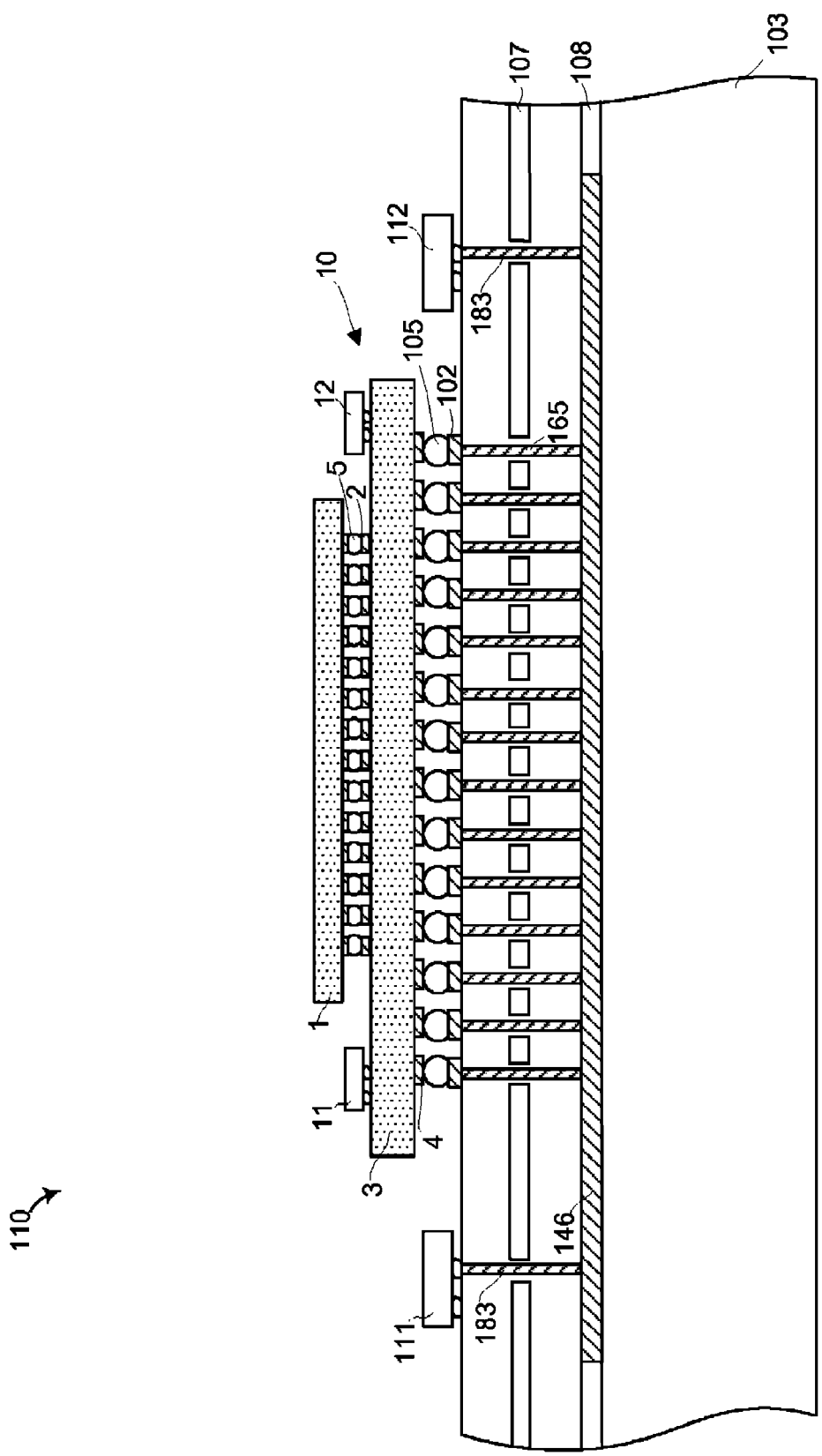
FIG. 9 is a cross sectional view along section E-E shown in FIG. 7, of the packaged integrated circuit device, where contiguous metallization in the power plane that forms a channel in the power plane is shown as a hatched fill area, in accordance with an embodiment of the present invention.
Figure 10:
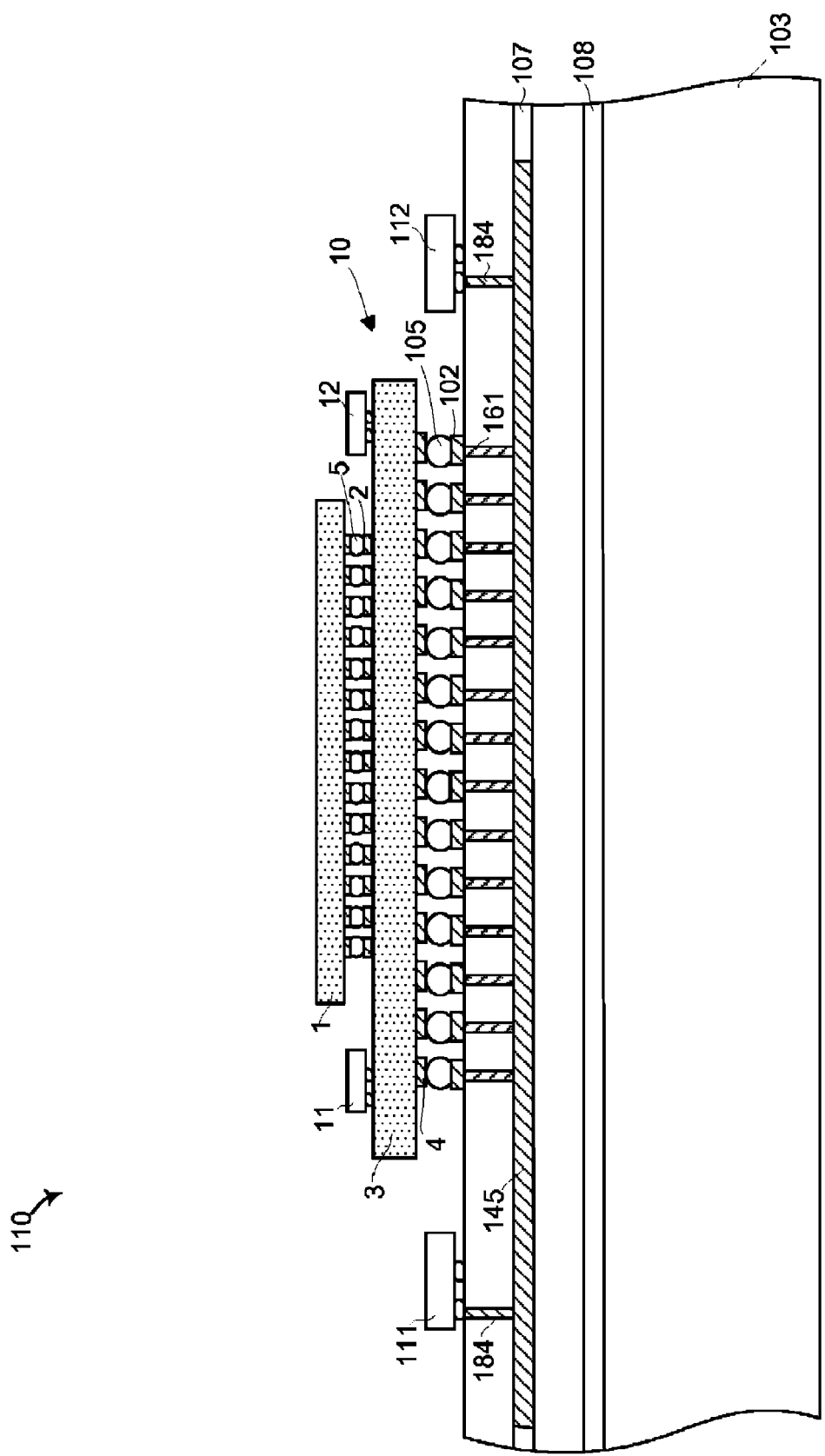
FIG. 10 is a cross sectional view along section F-F shown in FIG. 9, of the packaged integrated circuit device, where contiguous metallization in the ground plane that forms a channel in the ground plane is shown as a hatched fill area, in accordance with an embodiment of the present invention.

FIGS. 8-10 show a circuit board assembly 110 that includes circuit board assembly 100 of FIG. 7 and packaged integrated circuit device 10 of FIGS. 1-6. In the present embodiment package integrated circuit device 10 is attached to grid array of contact pads 102 using solder balls 105.

Decoupling capacitors 111-112 are disposed on the top side of circuit board 103. Each decoupling capacitor 111-112 is electrically coupled to first channel 145 and electrically coupled to second channel 146, and extends directly over a portion of first channel 145 and directly over a portion of second channel 146. Decoupling capacitor 111 extends proximate one end of first channel 145 and second channel 146, and decoupling capacitor 112 extends proximate the opposite end of first channel 145 and second channel 146. In the present embodiment decoupling capacitors 111-112 are discrete devices that are electrically coupled to a via 184 that contacts first channel 145 and a via 183 that contacts second channel 146. In the present embodiment, each decoupling capacitor 111-112 attaches to vias 183 and 184 using solder or conductive adhesive.

Additional decoupling capacitors 113-114 are disposed on the top side of circuit board 103. Each of additional decoupling capacitors 113-114 extends directly over a portion of second channel 146 and directly over a portion of third channel 147. Each decoupling capacitor 113-114 is electrically coupled to second channel 146 and electrically coupled to third channel 147. In the present embodiment each of additional decoupling capacitors 113-114 is a discrete device that is electrically coupled to a via that attaches to second channel 146 and a different via that attaches to third channel 147. In the present embodiment, solder or conductive adhesive is used to attach each decoupling capacitor 111-114 to a conductive structure on the top surface of circuit board 103.

Vias 161 attach to contact pads 102 in row 135, vias 162 attach to contact pads 102 in row 136, vias 163 attach to contact pads 102 in row 140, vias 164 attach to contact pads 102 in row 141, vias 165 attach to contact pads 102 in row 137, vias 166 attach to contact pads 102 in row 138, and vias 167 attach to contact pads 102 in row 139. Each via 165-167 extends through an opening in ground plane 107 and contacts channel 146. Each via 161-162 contacts channel 145 and each via 163-164 contacts channel 147.

Circuit board 103 can be formed by integrating layers of dielectric and conductive material, and patterning a top conductive layer to form grid array of contact pads 102. Vias 161-167 can be formed by etching or drilling openings, and filing the openings with conductive material to isolate vias 165-167 from ground plane 7.

In the present embodiment channels 145-147 extend laterally past decoupling capacitors 111-114. Therefore, the contiguous metallization of channel 145 extends directly under rows of contact pads 134-136 and under portions of decoupling capacitor 111-112. The contiguous metallization of channel 146 extends directly under rows of contact pads 137-139 and under portions of decoupling capacitor 111-114. The contiguous metallization of channel 147 extends directly under rows of contact pads 140-141 and under portions of decoupling capacitor 113-114. Because each of channels 145-147 extends under more than one row of contact pads, they each have significant width. Moreover, channels 145 and 147 are not interrupted by vias that couple to power, signal pins or isolation rings, and channel 146 is not interrupted by vias that couple to ground, signal pins or isolation rings. Accordingly, circuit board 103 provides a significant amount of contiguous metallization that is used to provide power and ground to a semiconductor die 1. In addition, because decoupling capacitors 11-14 are connected directly to a power channel and a ground channel by a via, and because the contiguous metallization of channels 145-147 extends directly under each decoupling capacitor 111-114, power and ground are effectively coupled between decoupling capacitors 111-114 and integrated circuit device 10. When this is combined with the corresponding channels 45-47 and capacitors 11-14 on integrated circuit device 10, a circuit board assembly 110 is obtained that can effectively provide power and ground to high frequency, high current devices such as content addressable memories.

Figure 11:
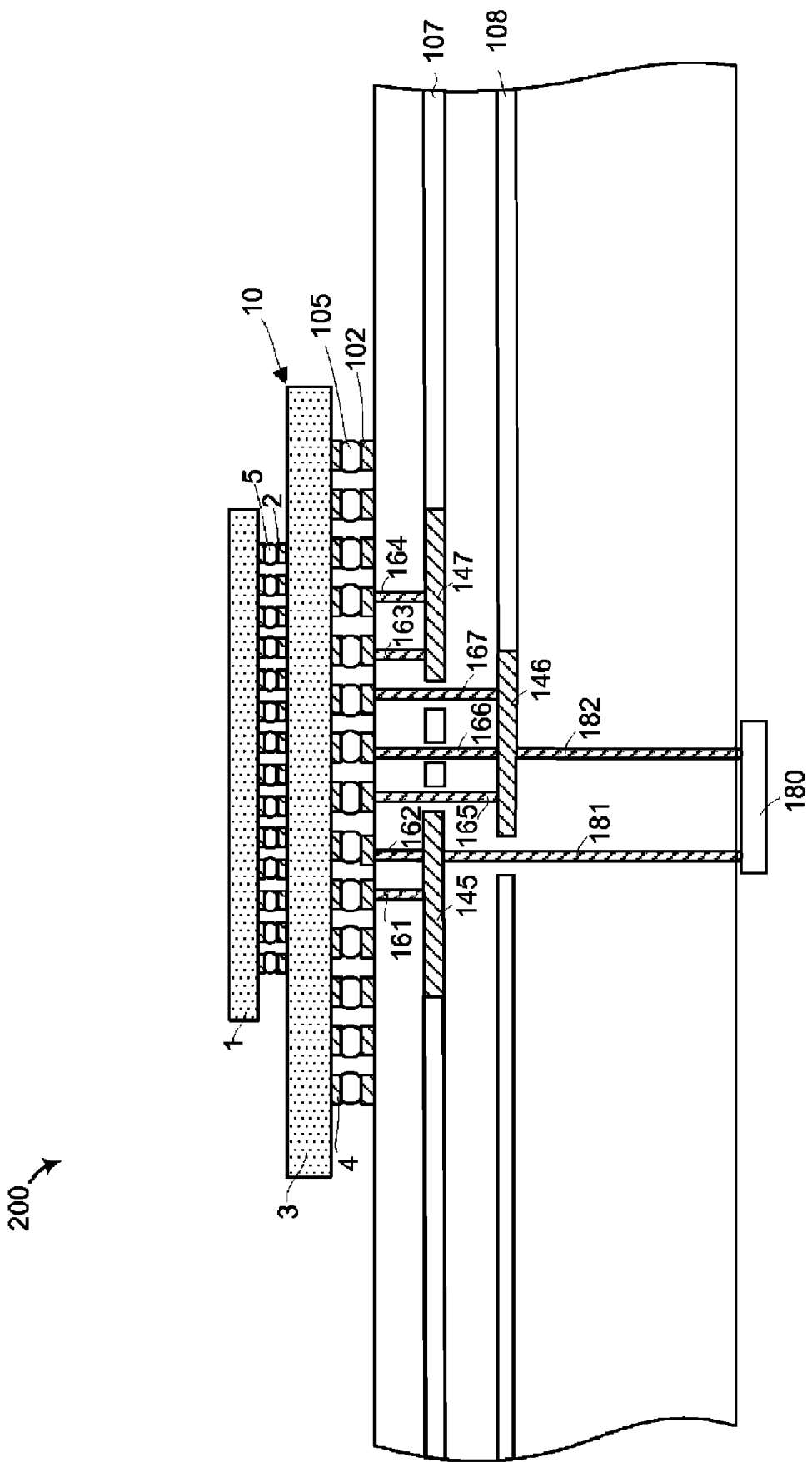
FIG. 11 is a cross sectional view of a circuit board assembly that includes a decoupling capacitor that is attached to the bottom surface of the circuit board, where contiguous metallization in the power plane that forms channels in the power plane and in the ground plane are shown as a hatched fill area, in accordance with an embodiment of the present invention.

In FIG. 11, an a circuit board assembly 200 is shown that has all of the features of the embodiment shown in FIGS. 7-10, and that includes one or more additional decoupling capacitor 180 that is coupled to the bottom of circuit board 103. In the present embodiment a first via 181 that attaches to first channel 145 couples ground to decoupling capacitor 180 and a second via 182 that attaches to channel 146 couples power to decoupling capacitor 180. In the present embodiment, decoupling capacitor 180 is a discrete device that is attached to vias 181-182 using solder or conductive adhesive. Though FIG. 11 shows a single decoupling capacitor 180 on the bottom of circuit board 103, in one embodiment multiple decoupling capacitors are disposed on the bottom of circuit board 103.

Figure 12:
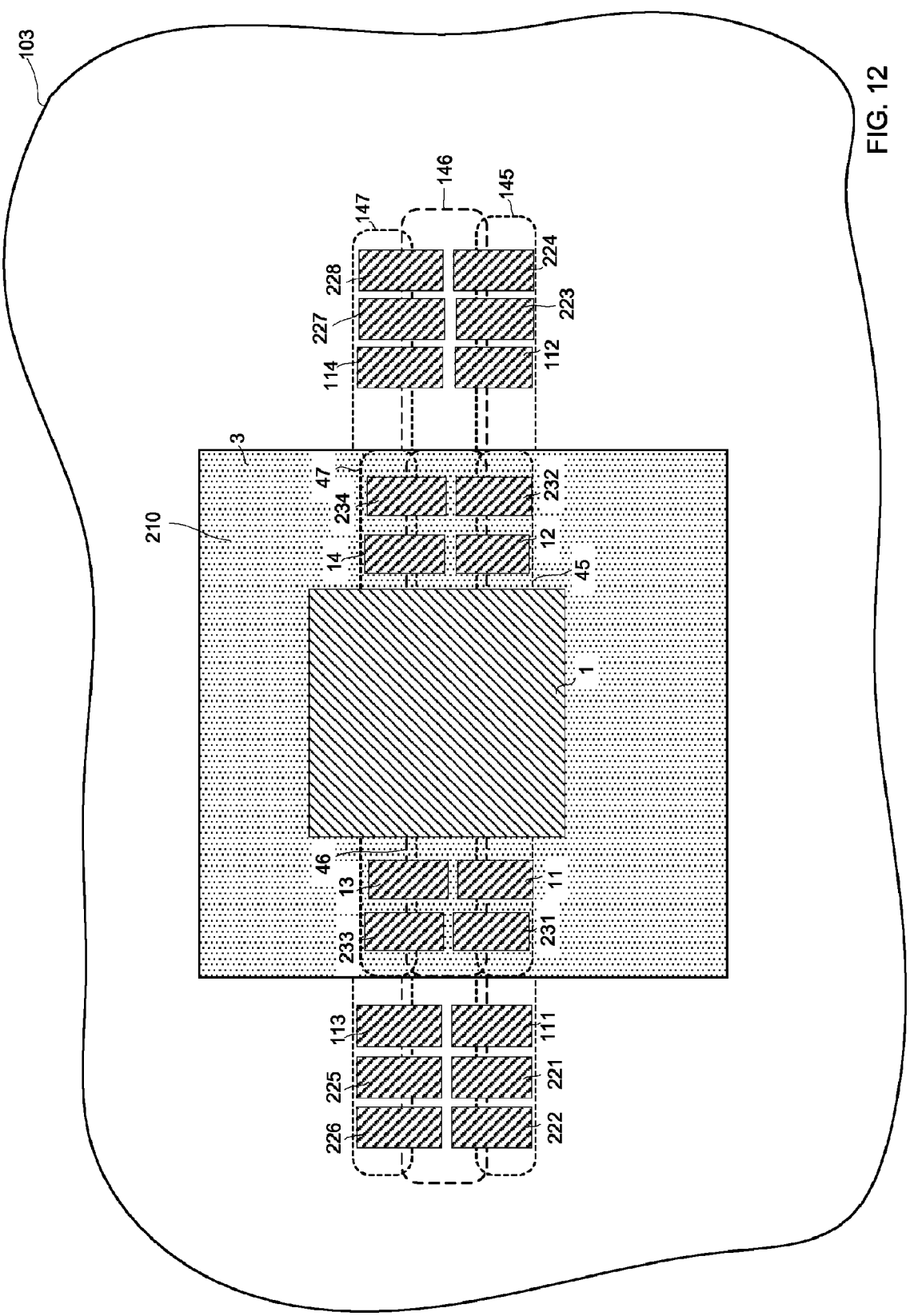
FIG. 12 is a top view of a circuit board assembly that includes twelve decoupling capacitors disposed on the circuit board and eight decoupling capacitors disposed on the package substrate, in accordance with an embodiment of the present invention.

In FIG. 12, a circuit board assembly is shown that includes a packaged integrated circuit device 210 having additional decoupling capacitors 231-234 on the top surface of package substrate 3. Decoupling capacitors 231-232 extend over and are electrically coupled to channels 45-46; and decoupling capacitors 233-234 extend over and are electrically coupled to channels 46-47. Additional capacitors 221-228 are attached to the top surface of circuit board 103. More particularly, decoupling capacitors 221-224 extend over and are electrically coupled to channels 145-146; and decoupling capacitors 225-228 extend over and are electrically coupled to channels 146-147.

Though the embodiments of FIGS. 1-12 are shown to include three channels 45-47, alternatively, packaged integrated circuit device 10 could have fewer or more channels. In one alternate embodiment package substrate 3 only includes two channels. In this embodiment package substrate 3 only includes sets of adjacent rows of contact pads 15-16 and 25-26, includes only channels 45 and 46, and includes only decoupling capacitors 11-12. Also, circuit board assembly 103 could include fewer or more channels. In one alternate embodiment circuit board assembly 103 only includes sets of adjacent rows of contact pads 115-116, only channels 145-146 and only decoupling capacitors 111-112.

In the embodiments shown in FIGS. 1-12, sets of adjacent rows of contact pads are used to form channels. Alternatively, sets of adjacent columns of contact pads could be used. Accordingly, each set of adjacent rows of contact pads can be a set of adjacent rows or columns of contact pads.

Although the methods and apparatus of the present invention are discussed with reference to the use of channels for coupling power and ground, it is appreciated that the methods of the present invention can be used to provide multiple different voltage levels to die 1. In one embodiment, a separate channel is used to provide each voltage level to die 1, with some or all of the different voltages coupled to decoupling capacitors as is illustrated in FIGS. 1-12.

Figure 13:
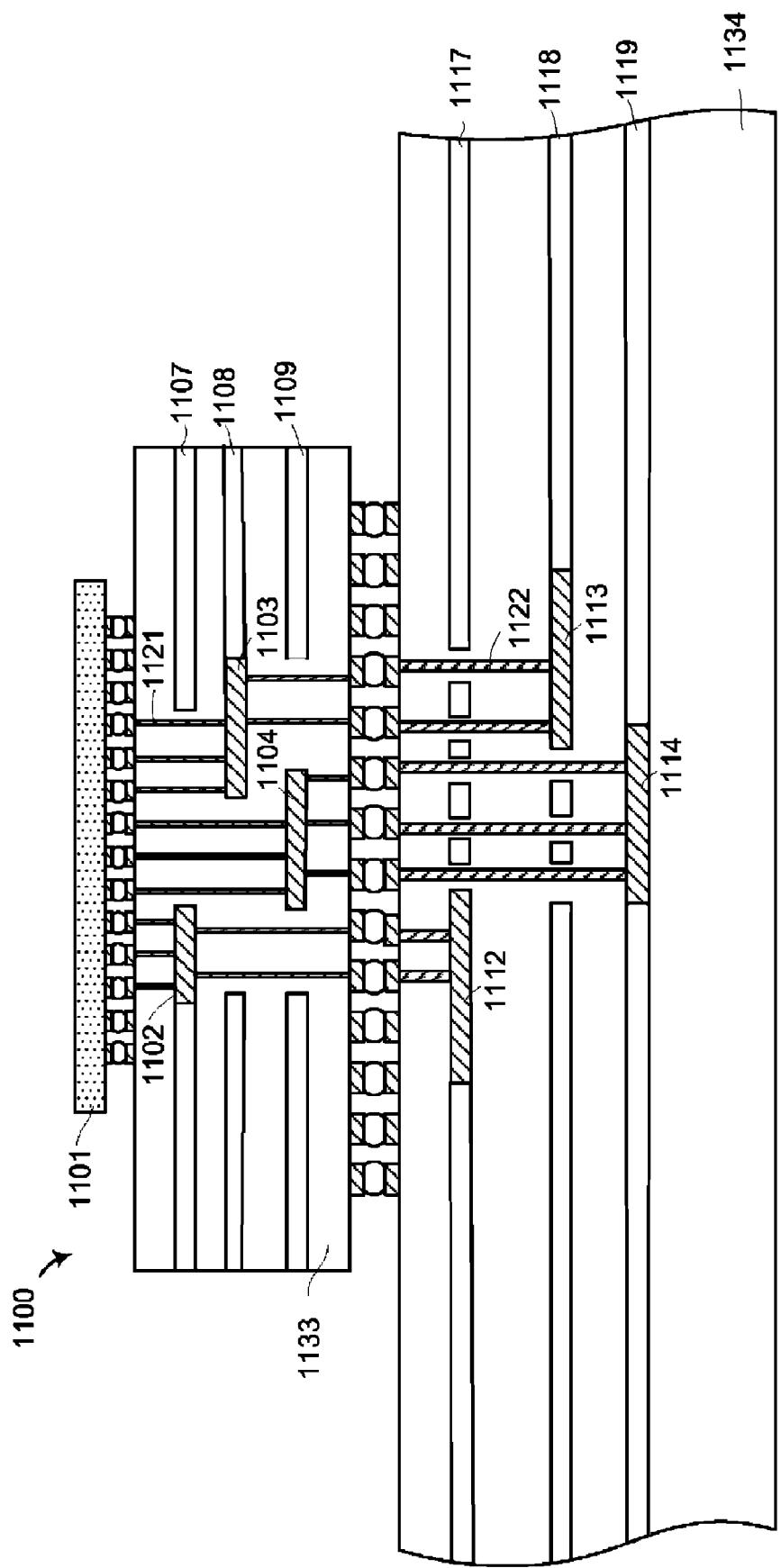
FIG. 13 is a cross sectional view of a circuit board assembly that includes three channels in the package substrate and three channels in the circuit board, in accordance with an embodiment of the present invention.

In one embodiment that is illustrated in FIG. 13, board assembly 1100 includes a semiconductor die 1101 that utilizes three voltage levels, a first voltage level that is coupled to the die through a first plane 1107, a second voltage level that is coupled to die 1101 through a second plane 1108 and a third voltage level that is coupled to die 1101 through a third plane 1109. In the present embodiment package substrate 1133 includes a first channel 1102 that extends within first plane 1107, a second channel 1103 that extends within second plane 1108 and a third channel 1104 that extends within third plane 1109. Vias 1121 couple corresponding contacts on the top and bottom of package substrate 1133 to channels 1102-1104.

Continuing with FIG. 13, circuit board 1134 includes a first plane 1117 within which a first channel 1112 extends, a second plane 1118 within which a second channel 1113 extends, and a third plane 1119 within which a third channel 1114 extends. Vias 1122 couple channels 1112-1114 to corresponding contacts on the top of circuit board 1134. In one embodiment the first voltage level is a first supply voltage level $V_{DD1}$, the second voltage level is a second supply voltage level $V_{DD2}$ and the third voltage level is a voltage level $V_{SS}$. In one embodiment $V_{SS}$ is ground (e.g., 0 volts), $V_{DD1}$ is 1.0 volt and $V_{DD2}$ is 0.65 volts. In the present embodiment channels 1102-1104 are coupled to decoupling capacitors on the top of package substrate 1133 and channels 1112-1114 are coupled to decoupling capacitors on the top of circuit board 1134 in the same manner as shown in the embodiments of FIGS. 1-12. In one embodiment one or more of channels 1112-1114 are also coupled to capacitors on the bottom of circuit board 1134.

In the embodiments shown in FIGS. 1-13, sets of adjacent rows of contact pads are used to form channels. Alternatively, sets of adjacent columns of contact pads could be used. Accordingly, each set of adjacent rows of contact pads can be a set of adjacent rows or columns of contact pads.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims, not by the above detailed description.

What is claimed is:

1. A packaged integrated circuit device comprising:
   a semiconductor die;
   a plurality of decoupling capacitors, the plurality of decoupling capacitors including a first decoupling capacitor and a third decoupling capacitor that extend on one side of the semiconductor die, and a second decoupling capacitor and a fourth decoupling capacitor that extend on the opposite side of the semiconductor die;
   a package substrate that includes a first grid array of contact pads that are electrically coupled to corresponding contact pads on the semiconductor die, the first grid array of contact pads including a first set of adjacent rows or columns of contact pads, all of the contact pads in the first set of adjacent rows or columns of contact pads coupled to a first channel of contiguous metallization that extends within a ground plane of the package substrate, a second set of adjacent rows or columns of contact pads, all of the contact pads in the second set of adjacent rows or columns of contact pads electrically coupled to a second channel of contiguous metallization that extends within a power plane of the package substrate and a third set of adjacent rows or columns of contact pads, all of the contact pads in the third set of adjacent rows or columns of contact pads coupled to a third channel of contiguous metallization that extends within a ground plane of the package substrate, all of the contact pads in the first set of adjacent rows or columns of contact pads directly overlying a portion of the first channel, all of the contact pads in the second set of adjacent rows or columns of contact pads directly overlying a portion of the second channel and all of the contact pads in the third set of adjacent rows or columns of contact pads directly overlying a portion of the third channel; and
   wherein the first decoupling capacitor is electrically coupled to the first channel and the second channel proximate one end of the first channel and the second channel, and a the second decoupling capacitor is electrically coupled to the first channel and the second channel proximate an opposite end of the first channel and the second channel, the third decoupling capacitor is electrically coupled to the second channel and is electrically coupled to the third channel proximate one end of the third channel, and the fourth decoupling capacitor is electrically coupled to the third channel proximate an opposite end of the third channel, the first channel, the second channel and the third channel extending contiguously between the first decoupling capacitor and the second decoupling capacitor and the third channel extending contiguously between the third decoupling capacitor and the fourth decoupling capacitor.

2. A packaged integrated circuit device as recited in claim 1 further comprising a plurality of vias, wherein the first decoupling capacitor and the second decoupling capacitor are electrically coupled to the first channel and the second channel by some of the plurality of vias, and wherein the third decoupling capacitor and the fourth decoupling capacitor are electrically coupled to the second channel by others of the plurality of vias.

3. A packaged integrated circuit device as recited in claim 1 wherein the semiconductor die comprises a content addressable memory.

4. A packaged integrated circuit device as recited in claim 1 further comprising a plurality of additional decoupling capacitors that are disposed on the same side of the package substrate as the semiconductor die, wherein each of the plurality of additional decoupling capacitors are electrically coupled to the second channel and to either the first channel or the third channel.

5. A packaged integrated circuit device as recited in claim 4 wherein each of the plurality of additional decoupling capacitors is a discrete device that is electrically coupled to a via that contacts the second channel and a different via that contacts either the first channel or the third channel.

6. A circuit board assembly comprising:
a circuit board that includes a first grid array of contact pads disposed on a top side of the circuit board, the first grid array of contact pads including a first set of adjacent rows or columns of contact pads, a second set of adjacent rows or columns of contact pads and a third set of adjacent rows or columns of contact pads, all of the contact pads in the first set of adjacent rows or columns of contact pads coupled to a first channel of contiguous metallization that extends within a ground plane of the circuit board, all of the contact pads in the second set of adjacent rows or columns of contact pads coupled to a second channel of contiguous metallization that extends within a power plane of the circuit board, and all of the contact pads in the third set of adjacent rows or columns of contact pads coupled to a third channel of contiguous metallization that extends within a ground plane of the circuit board, all of the contact pads in the first set of adjacent rows or columns of contact pads directly overlying a portion of the first channel, all of the contact pads in the second set of adjacent rows or columns of contact pads directly overlying a portion of the second channel, and all of the contact pads in the third set of adjacent rows or columns of contact pads directly overlying a portion of the third channel; and
a plurality of decoupling capacitors disposed on the top side of the circuit board, some of the plurality of decoupling capacitors extending directly over a portion of the first channel and directly over a portion of the second channel and electrically coupled to the first channel and the second channel, and others of the plurality of decoupling capacitors extending directly over a portion of the second channel and directly over a portion of the third channel and electrically coupled to the second channel and the third channel, the first channel extending contiguously between the decoupling capacitors disposed on one side of the first grid array of contact pads that are coupled to the first channel and the decoupling capacitors on the opposite side of the first grid array of contact pads that are coupled to the first channel, the second channel extending contiguously between the decoupling capacitors disposed on one side of the first grid array of contact pads that are coupled to the second channel and the decoupling capacitors on the opposite side of the first grid array of contact pads that are coupled to the second channel, and the third channel extending contiguously between the decoupling capacitors disposed on one side of the first grid array of contact pads that are coupled to the third channel and the decoupling capacitors on the opposite side of the first grid array of contact pads that are coupled to the third channel.

7. A circuit board assembly as recited in claim 6 wherein each of the plurality of decoupling capacitors is a discrete device that is electrically coupled to a via that contacts the second channel and a different via that contacts either the first channel or the third channel.

8. A circuit board assembly as recited in claim 7 wherein the plurality of decoupling capacitors comprise a first decoupling capacitor that extends proximate one end of the first channel and the second channel, and a second decoupling capacitor that extends proximate an opposite end of the first channel and the second channel.

9. A packaged integrated circuit device comprising:
a semiconductor die;
a plurality of decoupling capacitors, the plurality of decoupling capacitors including a first decoupling capacitor and a third decoupling capacitor that extend on one side of the semiconductor die, and a second decoupling capacitor and a fourth decoupling capacitor that extend on the opposite side of the semiconductor die;
a package substrate that includes a first grid array of contact pads that are electrically coupled to corresponding contact pads on the semiconductor die, the first grid array of contact pads including a first set of adjacent rows or columns of contact pads, all of the contact pads in the first set of adjacent rows or columns of contact pads coupled to a first channel of contiguous metallization that extends within a first plane of the package substrate, a second set of adjacent rows or columns of contact pads, all of the contact pads in the second set of adjacent rows or columns of contact pads electrically coupled to a second channel of contiguous metallization that extends within a second plane of the package substrate and a third set of adjacent rows or columns of contact pads, all of the contact pads in the third set of adjacent rows or columns of contact pads coupled to a third channel of contiguous metallization that extends within a third plane of the package substrate, all of the contact pads in the first set of adjacent rows or columns of contact pads directly overlying a portion of the first channel, all of the contact pads in the second set of adjacent rows or columns of contact pads directly overlying a portion of the second channel and all of the contact pads in the third set of adjacent rows or columns of contact pads directly overlying a portion of the third channel; and
wherein the first decoupling capacitor is electrically coupled to the first channel and the second channel proximate one end of the first channel and the second channel, and the second decoupling capacitor is electrically coupled to the first channel and the second channel proximate an opposite end of the first channel and the second channel, the third decoupling capacitor is electrically coupled to the second channel and is electrically coupled to the third channel proximate one end of the third channel, and the fourth decoupling capacitor is electrically coupled to the third channel proximate an opposite end of the third channel, the first channel, the second channel and the third channel extending contiguously between the first decoupling capacitor and the second decoupling capacitor and the third channel extending contiguously between the third decoupling capacitor and the fourth decoupling capacitor, the first channel coupling a first voltage level to the semiconductor die, the second channel coupling a second voltage level to the semiconductor die that is different from the first voltage level.

10. A packaged integrated circuit device as recited in claim 9 wherein the first voltage level is power and the second voltage level is ground.

11. A packaged integrated circuit device as recited in claim 10 wherein the third channel couples the first voltage level to the semiconductor die.

12. A packaged integrated circuit device as recited in claim 9 wherein the third channel couples a third voltage level to the semiconductor die, the third voltage level different from the first voltage level and different from the second voltage level.

* * * * *